United States Patent
Park et al.

(10) Patent No.: US 8,441,472 B2
(45) Date of Patent: May 14, 2013

(54) METHOD OF DRIVING DISPLAY PANEL

(75) Inventors: Jae-Gun Park, Seongnam (KR); Gon-Sub Lee, Seoul (KR); Su-Hwan Lee, Seoul (KR); Sung-Ho Seo, Seoul (KR); Woo-Sik Nam, Hwasung (KR); Dong-Won Shin, Seoul (KR); Dal-Ho Kim, Seoul (KR); Hyun-Min Seung, Seoul (KR); Jong-Dae Lee, Euijeongbu (KR)

(73) Assignee: Industry-University Corporation Foundation Hanyang University, Seoul (KR)

( * ) Notice: Subject to any disclaimer, the term of this patent is extended or adjusted under 35 U.S.C. 154(b) by 335 days.

(21) Appl. No.: 12/451,066

(22) PCT Filed: Apr. 24, 2008

(86) PCT No.: PCT/KR2008/002339
§ 371 (c)(1),
(2), (4) Date: Apr. 13, 2011

(87) PCT Pub. No.: WO2008/130207
PCT Pub. Date: Oct. 30, 2008

(65) Prior Publication Data
US 2011/0205217 A1    Aug. 25, 2011

(30) Foreign Application Priority Data
Apr. 24, 2007    (KR) .................. 10-2007-0039844

(51) Int. Cl.
*G09G 5/00* (2006.01)
*G06F 3/038* (2006.01)
(52) U.S. Cl.
USPC .............................. 345/212; 345/77; 345/80

(58) Field of Classification Search ............... 345/76, 345/77, 80, 82, 84, 211, 212; 315/169.1, 315/169.3; 349/19.33
See application file for complete search history.

(56) References Cited

U.S. PATENT DOCUMENTS

| | | | | |
|---|---|---|---|---|
| 4,975,691 | A * | 12/1990 | Lee ................................. | 345/79 |
| 5,764,225 | A * | 6/1998 | Koshobu ....................... | 345/211 |
| 5,917,466 | A * | 6/1999 | Soda et al. .................... | 345/100 |
| 6,989,824 | B1 * | 1/2006 | Ishii et al. ..................... | 345/204 |
| 8,315,080 | B2 * | 11/2012 | Park et al. ..................... | 365/111 |
| 2002/0158892 | A1 * | 10/2002 | Kim et al. ..................... | 345/690 |
| 2005/0104835 | A1 * | 5/2005 | Misonou et al. ................ | 345/96 |
| 2006/0076898 | A1 * | 4/2006 | Kitazawa ................... | 315/169.3 |
| 2007/0040770 | A1 * | 2/2007 | Kim ............................... | 345/76 |
| 2007/0222737 | A1 * | 9/2007 | Kimura ......................... | 345/100 |
| 2007/0263016 | A1 * | 11/2007 | Naugler et al. ............... | 345/690 |
| 2008/0074362 | A1 * | 3/2008 | Ogura ............................ | 345/77 |
| 2009/0046043 | A1 * | 2/2009 | Ono et al. ...................... | 345/79 |

FOREIGN PATENT DOCUMENTS

| | | |
|---|---|---|
| JP | 09-116106 | 5/1997 |
| JP | 2004-040094 | 2/2004 |
| KR | 1020060070350 | 6/2006 |

* cited by examiner

*Primary Examiner* — Joe H Cheng
(74) *Attorney, Agent, or Firm* — Harness, Dickey & Pierce, P.L.C.

(57) ABSTRACT

Provided is a method of driving a display panel having a charge trap device and an organic light emitting diode (OLED). The charge trap device includes a nanocrystal layer. The nanocrystal layer includes nanocrystals, which are crystallized and dispersed, and a barrier layer, which buries the nanocrystals. When a program voltage is applied, charges are trapped in the nanocrystals, and the OLED emits light at a predetermined luminance with the application of a read voltage. Data signals are sequentially applied to all pixels of the display panel to express desired grayscales. The pixels of the display panel receive the read voltage and emit light at the same time.

20 Claims, 11 Drawing Sheets

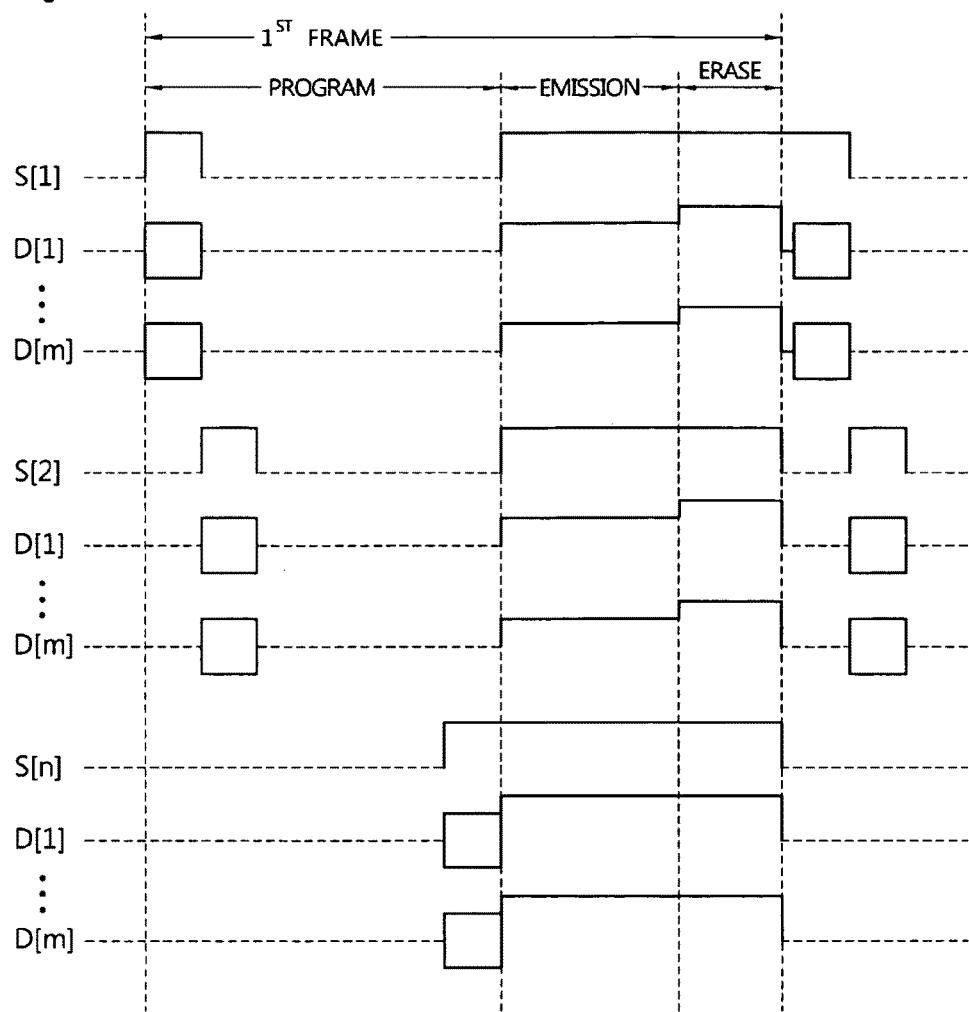

METHOD OF DRIVING DISPLAY PANEL

TECHNICAL FIELD

The present invention relates to a method of driving a light emitting diode, and more particularly, to a method of driving a display panel having a pixel using a charge trap device disposed on or under an organic emission layer (organic EML).

BACKGROUND ART

An organic light emitting diode (OLED) is a self-emissive device using an organic compound as a luminous body. That is, when a voltage is applied to the organic compound, injected electrons and holes recombine in the organic compound, and energy generated by the recombination excitesorganic molecules to emit light. An OLED display device has self-emissive characteristics and advantages of a wide viewing angle, a high definition, and a fast response time. Thus, the OLED display device has attracted considerable attention as a new display device that may replace a liquid crystal display (LCD), and small-sized OLED panels are being produced in large quantities.

OLED display devices are classified into passive matrix OLED (PMOLED) display devices and active matrix OLED (AMOLED) display devices according to a pixel structure. Above all, in an AMOLED display device, each pixel includes at least one transistor functioning as an active device. A scan signal and a data signal are applied to each pixel having at least one transistor. The corresponding pixel is selected in response to the scan signal, and the data signal is applied to the selected pixel. An OLED performs an emission operation at a predetermined luminance in response to the data signal applied to the pixel.

In the above-described AMOLED display device, each pixel includes at least one transistor. In most cases, the transistor is a thin film transistor (TFT) formed on a substrate. The TFT may use an a-Si layer or a poly-Si layer as a channel layer. When the a-Si layer is used as the channel layer, the mobility of carriers is low. Accordingly, a poly-Si layer having a carrier mobility of 10 $cm^2$/Vsec or more is used as the channel layer. In order to form the channel layer using poly-Si, an a-Si layer is formed at a low temperature, and a phase change of the a-Si layer into a poly-Si layer is induced using laser or catalyst. In the above-described process, a plurality of poly-Si channel layers are formed on a panel, thereby forming TFTs in respective pixels.

Also, transistors of an OLED panel must be set to have uniform electrical characteristics in order to realizeprecise image data. In other words, TFTs of respective pixels must be set to have the same electrical characteristics. However, in terms of a fabrication process, it is very difficult to form TFTs having uniform electrical characteristics over the entire area of the OLED panel. When the area of OLED panels gradually increases, a technique of forming TFTs significantly affects the yield of the OLED panels.

DISCLOSURE OF INVENTION

Technical Problem

As described above, conventional OLED display devices employ TFTs and require a crystallization technique that cannot be applied to large-area OLED display devices. Also, in the case of a bottom-emitting OLED display device, an aperture ratio may be reduced due to the formation of TFTs.

Particularly, in the case of a conventional AMOLED display device, a plurality of pixelsconnected to a scan line are selected in response to a scan signal, and a data signal is applied to the selected pixels to store desired grayscale data. Based on the stored grayscale data, TFTs are turned on/off and a current source operates to generate a driving current. An organic emission layer (EML) performs an emission operation in response to the driving current. Particularly, the generation of the driving current is greatly affected by a gate-source voltage difference Vgs and a threshold voltage Vth of a driving transistor included in a pixel. In order to perform a proper display operation, TFTs must be fabricated to have the same Vgs and Vth values over the entire area of the OLED panel. However, in conventional low-temperature poly-Si (LTPS) processes, it is difficult to fabricate TFTs having the same Vgs and Vth values over the entirearea of the OLED panels.

Furthermore, OLED display devices fabricated using conventional processes have specific technical limits for creating sequential images. For example, after a frame image is displayed in a conventional OLED display device, a new data signal is applied to and stored in the OLED display device where a previous-frame data signal is stored. In this case, the new data signal may not be efficiently stored, and each pixel that performs an emission operation may not express precise grayscale.

Technical Solution

The present invention is directed a method of driving a display panel using a pixel having a charge trap device.

In example embodiments, a method of driving a display panel includes: sequentially applying a data signal corresponding to a program voltage or an erase voltage to pixels to put each of the pixels into a program state or an erase state; and applying a data signal corresponding to a read voltage to all the pixels put into the program state or the erase state such that all the pixels emit light at the same time.

In other example embodiments, a method of driving a display panel having pixels disposed in regions where a plurality of scan lines intersect a plurality of data lines includes: selecting a predetermined scan line and applying a data signal corresponding to a program voltage to pixels connected to the selected scan line to put charge trap devices of the pixels into a program state; and finishing programming all the pixels of the display panel, selecting all the pixels, and applying a data signal corresponding to a read voltage to all the pixels such that organic light emitting diodes (OLEDs) of all the pixels emit light at the same time, wherein each of the charge trap devices includes a nanocrystal layer in which charges are trapped, and each of the OLEDs is disposed on or under the corresponding charge trap device.

In still other example embodiments, a method of driving a display panel having a pixel including a charge trap device and an OLED includes: applying a program voltage to the pixel to control a resistance of the charge trap device; applying a read voltage to the pixel having the charge trap device of which the resistance is controlled to cause the OLED to emit light; and applying an erase voltage higher than the program voltage to the pixel to erase trapped charges from the charge trap device.

In yet other example embodiments, a method of driving a display panel having a pixel including a charge trap device and an OLED includes: applying a program voltage or an erase voltage to the pixel to control a resistance of the charge trap device; and applying a read voltage to the pixel having the charge trap device of which the resistance is controlled to cause the OLED to emit light, wherein the program voltage is lower than the erase voltage and higher than the read voltage.

Advantageous Effects

In the present invention, each pixel of the display panel includes a charge trap device and an organic light emitting diode (OLED). The charge trap device is disposed on or under the OLED and performs a memory operation according to charges trapped in a nanocrystal layer. Also, pixels, which are in the erase state, are sequentially programmed, and all the pixels of the display panel emit light at the same time with the application of a read voltage.

According to the present invention as described above, each of pixels can have a high aperture ratio and a wide viewing angle and efficiently display an image through a mechanism in which the pixels are erased, programmed, and emit light at the same time. In particular, a residual image caused by an image having sequential frames can be eliminated, and grayscales can be expressed more clearly.

While the invention has been shown and described with reference to certain example embodiments thereof, it will be understood by those skilled in the art that various changes in form and details may be made therein without departing from the spirit and scope of the invention as defined by the appended claims.

BRIEF DESCRIPTION OF THE DRAWINGS

The above and other objects, features and advantages of the present invention will become more apparent to those of ordinary skill in the art by describing in detail example embodiments thereof with reference to the attached drawings, in which:

FIG. 19 is a timing diagram illustrating operation of the display panel shown in FIG. 17, according to another example embodiment of the present invention.

BEST MODE FOR CARRYING OUT THE INVENTION

Hereinafter, example embodiments of the present invention will be described in detail. However, the present invention is not limited to the embodiments disclosed below, but can be implemented in various forms. The following embodiments are described in order to enable those of ordinary skill in the art to embody and practice the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Structure of OLED Display Device

Figure 1:
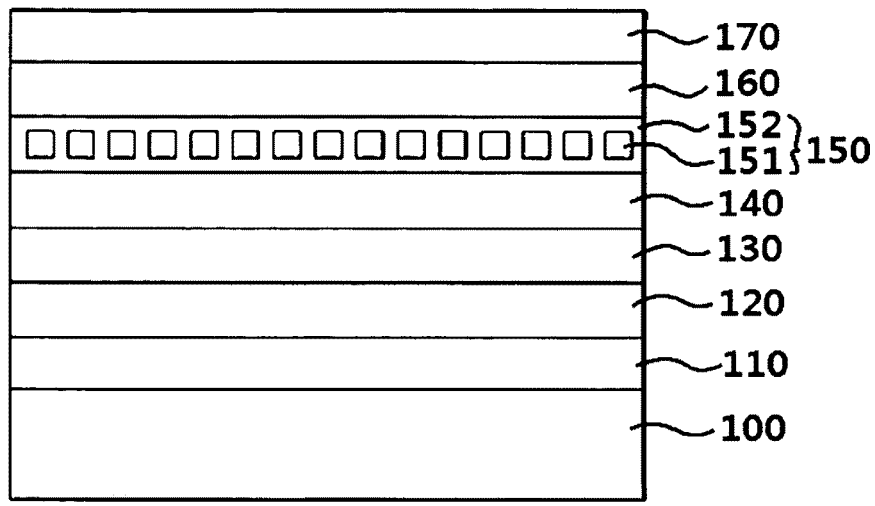
FIG. 1 is a cross-sectional view of a bottom-emitting organic light emitting diode (OLED) display device according to an example embodiment of the present invention.
Figure 1:
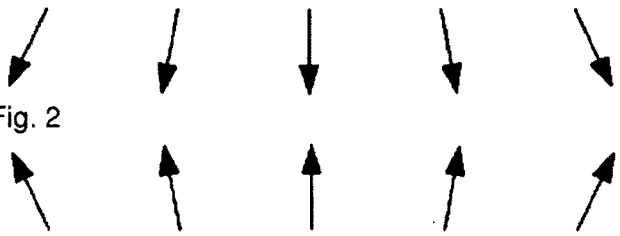

FIG. 1 is a cross-sectional view of a bottom-emitting organic light emitting diode (OLED) display device according to an example embodiment of the present invention.

Referring to FIG. 1, the OLED display device performs a bottom emission operation. A first conductive layer 110, an organic emission layer (organic EML) 120, a second conductive layer 130, a first organic layer 140, a nanocrystal layer 150, a second organic layer 160, and a third conductive layer 170 are disposed on a substrate 100. Also, a hole injection layer (HIL) (not shown) or a hole transport layer (HTL) may be further disposed between the first conductive layer 110 and the organic EML 120. Furthermore, an electron transport layer (ETL) (not shown) or an electron injection layer (EIL) may be further disposed between the organic EML 120 and the second conductive layer 130.

Any substrate that transmits light may be used as the substrate 100. Thus, the substrate 100 may be a plastic substrate, a glass substrate, an $Al_2O_3$ substrate, a SiC substrate, a ZnO substrate, a Si substrate, a GaAs substrate, a GaP substrate, a $LiAl_2O_3$ substrate, a BN substrate, an MN substrate, a silicon-on-insulator (SOI) substrate, or a GaN substrate. The plastic substrate may be a polyethylene (PE) substrate, a polyethersulfone (PES) substrate, a polyethylene terephtalate (PET) substrate, or a polyethylene naphthalate (PEN) substrate. When the substrate 100 exhibits semiconductivity or conductivity, an insulating material must be interposed between the first conductive layer 110 and the substrate 100. Also, the substrate 100 may be a flexible substrate. When the flexible substrate is used, a flexible display device or a wearable display device may be realized.

The first conductive layer 110 functions as an anode for emitting holes. Thus, the first conductive layer 110 may be formed of a transparent metal oxide having a large work function and transparency, for example, indium tin oxide (ITO) or indium zinc oxide (IZO). Alternatively, the first conductive layer 110 may be formed of a chemically stable conjugated polymer containing polythiophene. Alternatively, the first conductive layer 110 may be formed of a metal. When the first conductive layer 110 is formed of a metal, the first conductive layer 110 is formed to a small thickness so as to ensure transparency. For example, the formation of the first conductive layer 110 may include forming an Al layer to obtain a large work function and forming an ITO layer on the Al layer to ensure conductivity.

Holes and electrons combine in the organic EML 120 to generate light. The organic EML 120 may be formed of a polymer or a low molecular material. The low molecular material used for forming the organic EML 120 may include tris(8-hydroxyquinoline) aluminum (Alq3). The polymer used for forming the organic EML 120 may include poly(p-phenylenevinylene) (PPV), poly(p-phenylene) (PPP), or poly (fluorene)s.

Also, the HIL that is disposed between the first conductive layer 110 and the organic EML 120 may be formed of copper phthaloyanine (CuPc). The HTL that is disposed between the first conductive layer 110 and the organic EML 120 may be formed of a low molecular material such as α-NPD, or a polymer such as poly(n-vinylcarbazole) (PVK).

Furthermore, an electron transport layer (ETL) or an electron injection layer (EIL) may be further disposed between the organic EML 120 and the second conductive layer 130. The ETL may be formed of Alq3, and the EIL may be formed of lithium fluorine (LiF).

The second conductive layer 130 may function as a cathode for emitting electrons to the organic EML 120. Also, the second conductive layer 130 has electrical conductivity. The second conductive layer 130 may be formed of Al, Au, Pt, or Cu so that when the second conductive layer 130 contacts an organic material, interfacial characteristics therebetween can be maintained. Also, the second conductive layer 130 may be formed of a metal having a small work function, which can lower a barrier formed between the organic EML 120 and the second conductive layer 130 and increase a current density during the injection of electrons. Thus, the second conductive layer 130 may be formed of Al, which has a small work function and is chemically stable.

The first organic layer 140 may be formed of a polymer or a low molecular material. The polymer may include PVK or polystyrene (PS), and the low molecular material may include AlDCN, α-NPD, or Alq3.

The nanocrystal layer 150 may be charged or discharged to enable the programming or erasure of an OLED. The nanocrystal layer 150 may include a nanocrystal 151 and a barrier layer 152. The nanocrystal 151 may be formed of at least one selected from the group consisting of Al, Mg, Zn, Ni, Fe, Au, Ag, and an alloy thereof. The barrier layer 152 may be formed of an oxide and may surround the nanocrystal 151. For example, the nanocrystal 151 may be formed of Al, and the barrier layer 152 may be formed of $Al_xO_y$.

Like the first organic layer 140, the second organic layer 160 may be formed of a polymer or a low molecular material. The polymer may include PVK or PS, and the low molecular material may include AlDCN, α-NPD, or Alq3.

The third conductive layer 170 functions as a cathode for emitting charges to the nanocrystal layer 150. The third conductive layer 170 may be formed of any material having electrical conductivity.

Meanwhile, in FIG. 1, each of the organic EML 120 and the first and second organic layers 140 and 160 may be formed of a mixture of a polymer and a low molecular material.

Figure 2:
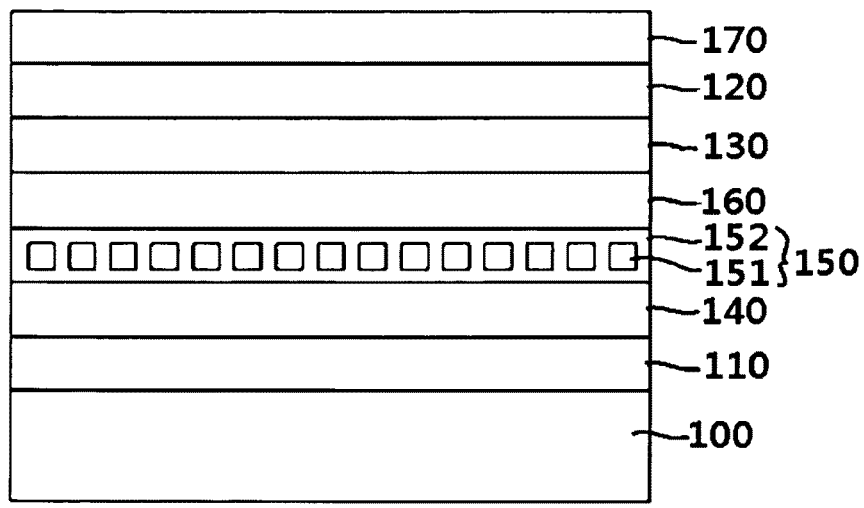
FIG. 2 is a cross-sectional view of a top-emitting OLED display device according to an example embodiment of the present invention.

FIG. 2 is a cross-sectional view of a top-emitting OLED display device according to an example embodiment of the present invention.

Referring to FIG. 2, the OLED display device performs a top emission operation. Thus, light generated in an organic EML 120 is emitted toward the top surface of the substrate 100 through a third conductive layer 170.

In FIG. 2, a first conductive layer 110 is a cathode for emitting electrons, and the third conductive layer 170 is an anode for emitting holes. Accordingly, the electrical function and material of the first conductive layer 110 shown in FIG. 2 are the same as those of the third conductive layer 170 shown in FIG. 1, and the electrical function and material of the third conductive layer 170 shown in FIG. 2 are the same as those of the first conductive layer 110 shown in FIG. 1. The OLED display device of FIG. 2 is different from that of FIG. 1 in that a nanocrystal layer 150 is disposed under the organic EML 120.

The nanocrystal layer 150 may be formed by various methods. For example, a metal layer may be deposited in an evaporation chamber and oxidized, thereby forming the nanocrystal 151 and a barrier layer 152. Also, the nanocrystal layer 150 may be a single layer or a multiple layer obtained by stacking a plurality of nanocrystal layers.

Formation of Nanocrystal Layer

Also, the nanocrystal layer 150 may be formed by various methods. For example, two barrier layers and a metal layer interposed between the barrier layers may be formed and cured, thereby forming a nanocrystal buried by the barrier layers. Alternatively, an organic material in which nanocrystals are dispersed may be formed, and a buried nanocrystal may be formed in an organic layer.

Figure 3:
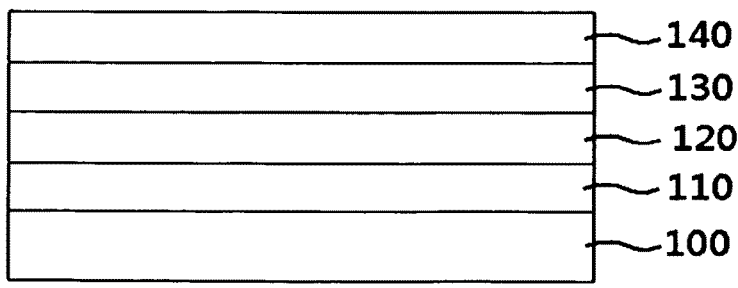
FIGS. 3 through 5 are cross-sectional views illustrating a method of forming a nanocrystal layer using an oxidation process according to an example embodiment of the present invention.
Figure 4:
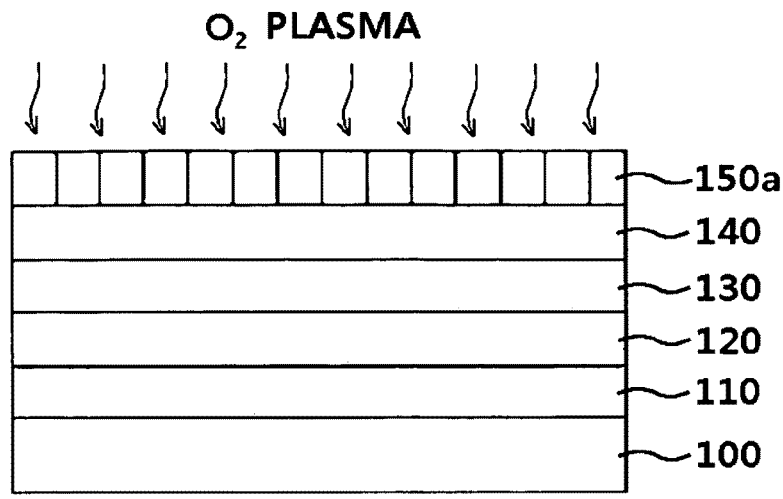
Figure 5:
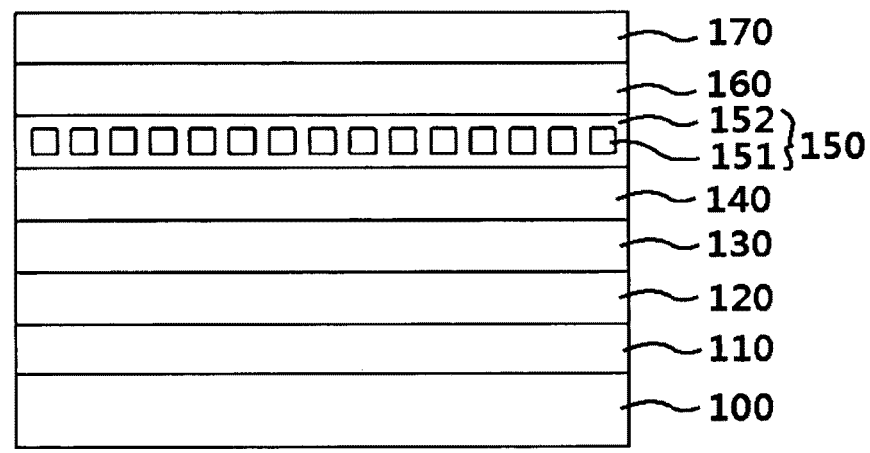

FIGS. 3 through 5 are cross-sectional views illustrating a method of forming a nanocrystal layer using an oxidation process according to an example embodiment of the present invention.

Referring to FIG. 3, a first conductive layer 110 is formed on a substrate 100. The first conductive layer 110 may be formed of a conductive metal into which holes are easily injected or an oxide thereof. For example, the first conductive layer 110 may be formed of ITO, IZO, Au, Ag, or Pt.

An HIL, an HTL, an organic EML 120, and an EIL are sequentially formed on the substrate 100 having the first conductive layer 110.

Thereafter, a second conductive layer 130 is formed on the organic EML 120 or the EIL. When the EIL is not formed, the second conductive layer 130 is formed directly on the organic EML 120. When the EIL or another functional thin layer is formed on the organic EML, the second conductive layer 130 is formed on the EIL or the functional thin layer.

A first organic layer 140 is formed on the second conductive layer 130.

Referring to FIG. 4, a nanocrystal layer 150 is formed on the first organic layer 140. Initially, a metal layer 150a is deposited on the first organic layer 140 and oxidized using $O_2$ plasma. The metal layer 150a may be formed to have grain boundaries.

In order to oxidize the metal layer 150a, an oxidation process is performed by injecting $O_2$ gas. During the oxidation process, $O_2$ plasma penetrates into the grain boundaries of the metal layer 150, thereby oxidizing the metal layer 150. Thus, a metal in the grain boundaries becomes a nanocrystal 151, and the surface of the nanocrystal 151 becomes an oxide. In other words, the nanocrystal 151 is buried in the oxide. The obtained oxide functions as a barrier layer 152.

The metal layer 150a may be obtained using a known deposition process, such as a thermal evaporation process, an electronic beam (e-beam) evaporation process, a sputtering process, a chemical vapor deposition (CVD) process, a metal organic CVD (MOCVD) process, a molecular beam epitaxy (MBE) process, or an atomic layer deposition (ALD) process.

Referring to FIG. 5, a second organic layer 160 and a third conductive layer 170 are sequentially formed on the nanocrystal layer 150.

Figure 6:
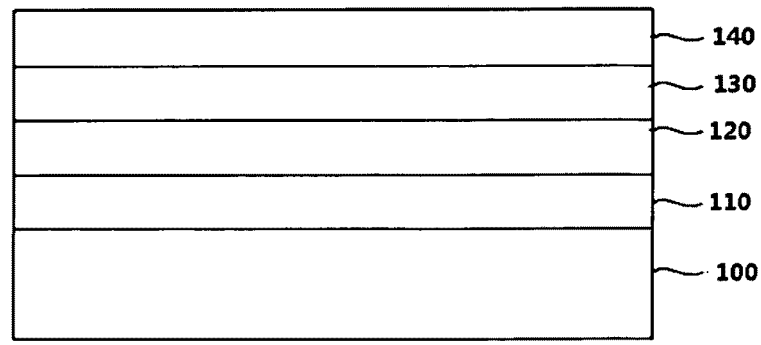
FIGS. 6 through 8 are cross-sectional views illustrating a method of forming a nanocrystal layer according to an example embodiment of the present invention.
Figure 7:
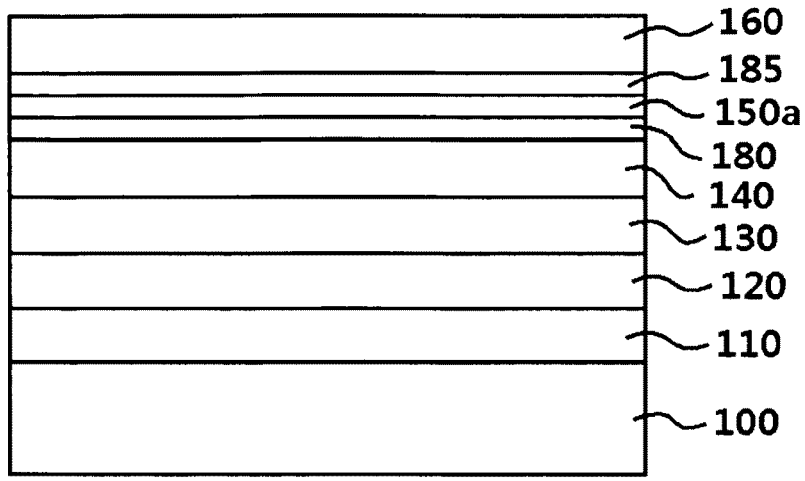
Figure 8:
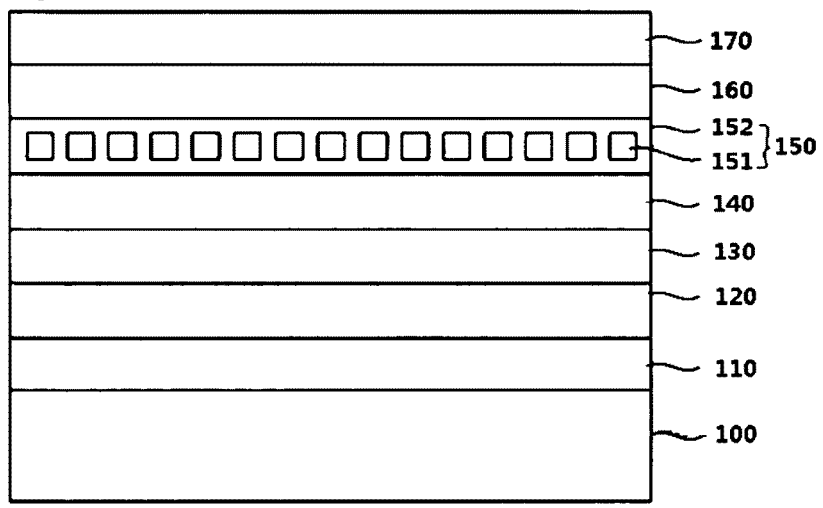

FIGS. 6 through 8 are cross-sectional views illustrating a method of forming a nanocrystal layer according to an example embodiment of the present invention.

Referring to FIG. 6, a first conductive layer 110, an organic EML 120, a second conductive layer 130, and a first organic layer 140 are formed on a substrate 100 in the same manner as described above with reference to FIG. 1.

Referring to FIG. 7, a first barrier layer 180, a metal layer 150a, a second barrier layer 185, and a second organic layer 160 are sequentially formed on the first organic layer 140.

The first and second barrier layers 180 and 185 are prepared to form an electron tunneling barrier 152, which surrounds a nanocrystal 151 of a nanocrystal layer 150, in a subsequent process. Also, the first and second barrier layers 180 and 185 may be formed of a metal oxide, such as $Al_2O_3$ or $TiO_2$. Furthermore, the metal layer 150a may be formed by a deposition process.

After the second organic layer 160 is formed, a curing process may be performed on the resultant structure. The curing process leads the first and second barrier layers 180 and 185 formed under and on the metal layer 150a to surround a nanocrystal region of the metal layer 150a.

As a result, the nanocrystal 151 is integrally formed with the electron tunneling barrier 152 as shown in FIG. 8. The curing process may be performed at a temperature of about 150 to 300 for about 0.5 to 4 hours.

In another example embodiment, the curing process may be performed before the second organic layer 160 is formed. In other words, forming the nanocrystal layer 150 using the curing process may be followed by forming the second organic layer 160 on the nanocrystal layer 150. Thereafter, a third conductive layer 170 is formed on the second organic layer 160, thereby completing the fabrication of the OLED display device shown in FIG. 8.

Figure 9:
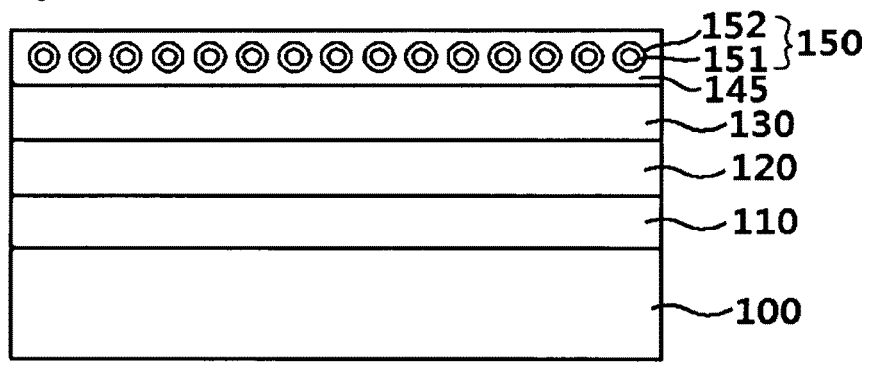
FIGS. 9 and 10 are cross-sectional views illustrating a method of forming a nanocrystal layer according to another example embodiment of the present invention.
Figure 10:
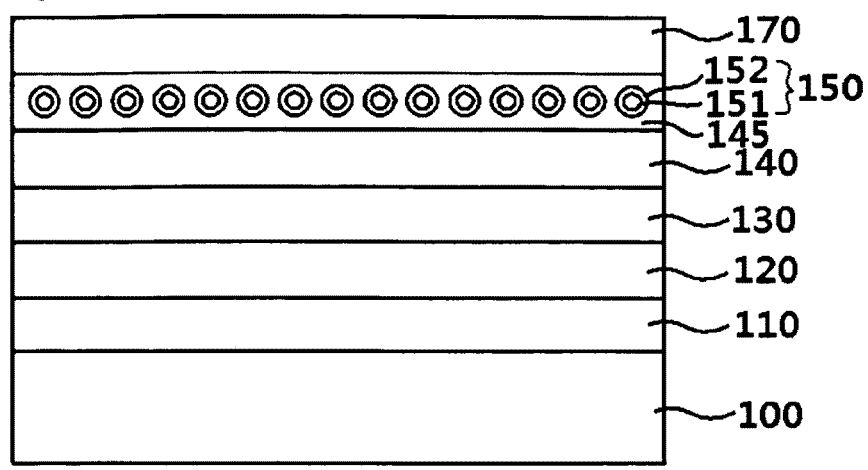

FIGS. 9 and 10 are cross-sectional views illustrating a method of forming a nanocrystal layer according to another example embodiment of the present invention.

Referring to FIG. 9, a first conductive layer 110, an organic EML 120, and a second conductive layer 130 are formed on a substrate 100.

Nanocrystals 151 are separately dispersed in an organic layer 145 functioning as a Schottky barrier layer. Also, each of the nanocrystals 151 is surrounded by a barrier layer 152. Accordingly, the nanocrystal layer 150 shown in FIG. 9 includes the nanocrystals 151, the barrier layers 152, and the organic layer 145.

In another example embodiment, the nanocrystals 151 may be dispersed in the organic layer 145 without forming the barrier layer 152.

In order to form the nanocrystal layer 150 shown in FIG. 9, a solution mixture of the nanocrystals 151 and an organic polymer is spin-coated and baked by natural drying or at a predetermined temperature. In the above-described process, the nanocrystals 151 may be uniformly dispersed in the organic layer 145 functioning as the Schottky barrier layer or surrounded by the bather layers 152. The formation of the nanocrystal layer 150 will now be described in more detail with reference to FIG. 11.

Figure 11:
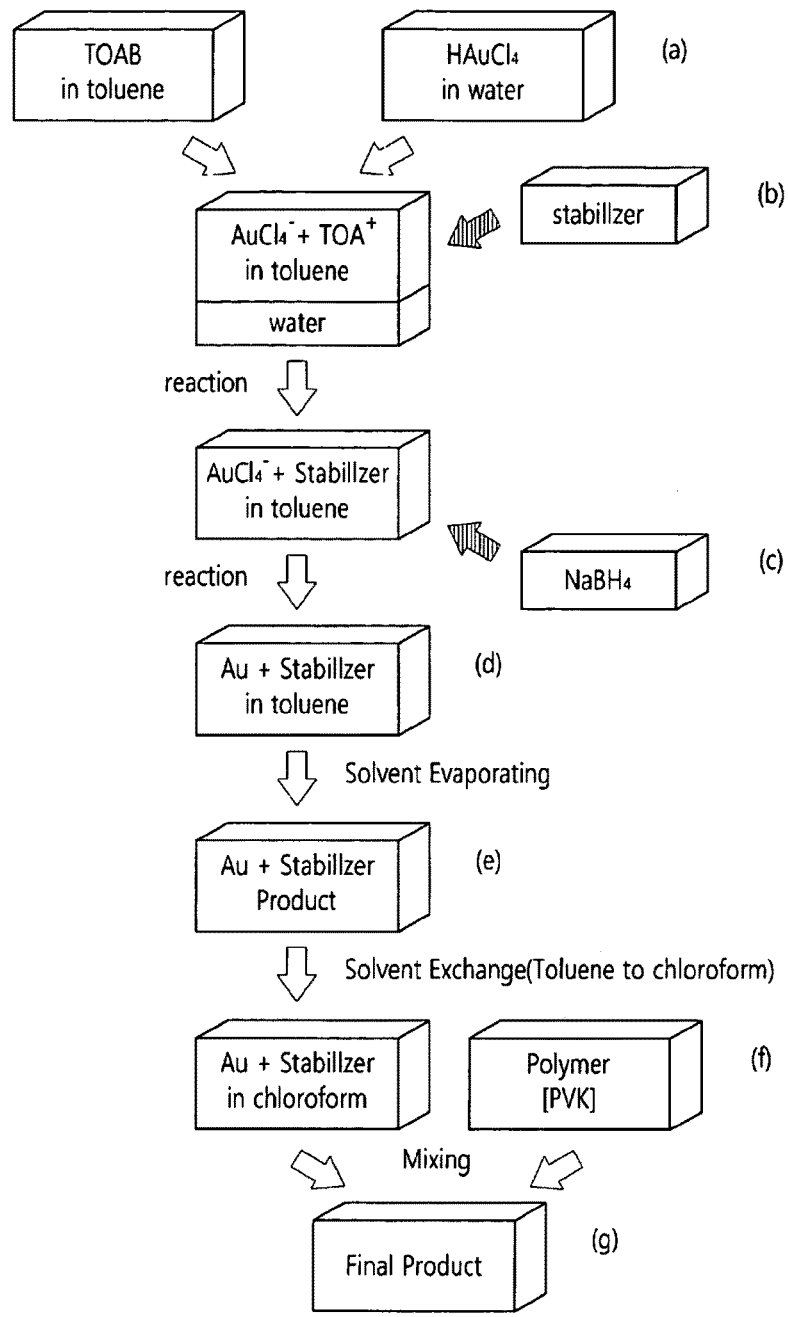
FIG. 11 is a flowchart illustrating a method of forming the nanocrystal layer shown in FIG. 9.

FIG. 11 is a flowchart illustrating a method of forming the nanocrystal layer shown in FIG. 9.

Referring to FIG. 11, $HAuCl_4$, which is a metal salt, is dissolved in deionized water (DIW), which is an aqueous solvent, to form a $HAuCl_4$ aqueous solution. In the aqueous solution, the metal salt ($HAuCl_4$) is ionized into $H^+$ and $AuCl_4^-$ and functions as an Au source. Also, tetraoctylammonium (TOAB) is dissolved in toluene, which is a nonaqueous solvent, to form a toluene solution containing ionized TOAB. The ionized TOAB functions as a phase-change catalyst for moving $AuCl_4^-$ containing a metal to the toluene solution in a subsequent process.

Thereafter, a mixture of the TOAB-containing toluene solution and the $HAuC_4$ aqueous solution is stirred, so that $AuCl_4^-$ containing a metal moves to the toluene solution. Also, carbazole terminated tiol (CB) may be added as a stabilizer to the toluene solution to aid uniform dispersing of Au-containing nanocrystals, and the CB- added toluene solution may be stirred. The stirring process may be performed at a room temperature for 5 to 20 minutes.

Subsequently, sodium brohydride ($NaBH_4$) may be added as a reducing agent to the CB-added toluene solution so as to reduce $AuCl_4^-$, and the mixture may be stirred. In this case, the stirring process may be performed at a speed of about 500 rpm or higher at a room temperature for 3 to 10 hours.

In the above-described process, a combination of the Au-containing nanocrystalsand CB is formed in the toluene solution. In this case, since the CB is formed to surround each of the nanocrystals, the CB functions not only as a stabilizer, but also as an electron tunneling barrier like barrier materials.

Thereafter, the toluene solution is evaporated, thereby leaving the combination of the Au-containing nanocrystalsand the CB.

The combination of the Au-containing nanocrystals and the CB is dissolved in chl oroform to form a chloroform solution so as to aid a mixture of the combination with a polymer. The chloroform solution in which the combination is dissolved is mixed with PVK, which is a polymer.

As a result, a final mixture solution of the nanocrystals surroundedby the CB and the polymer is obtained. The final mixture solution is spin-coated on the substrate 100, thereby forming an organic layer. The nanocrystals are dispersed in the organic layer, and the CB, which surrounds the nanocrystals, functions as a barrier layer.

Thereafter, referring to FIG. 10, a third conductive layer 170 is formed on the nanocrystal layer 150. The resultant structure shown in FIG. 10 may or may not include the first and second organic layers 140 and 160 shown in FIGS. 1 and 2. This is because the nanocrystal layer 150 includes the organic layer 145 formed of an organic polymer.

Characteristics of OLED Display Device

Figure 12:
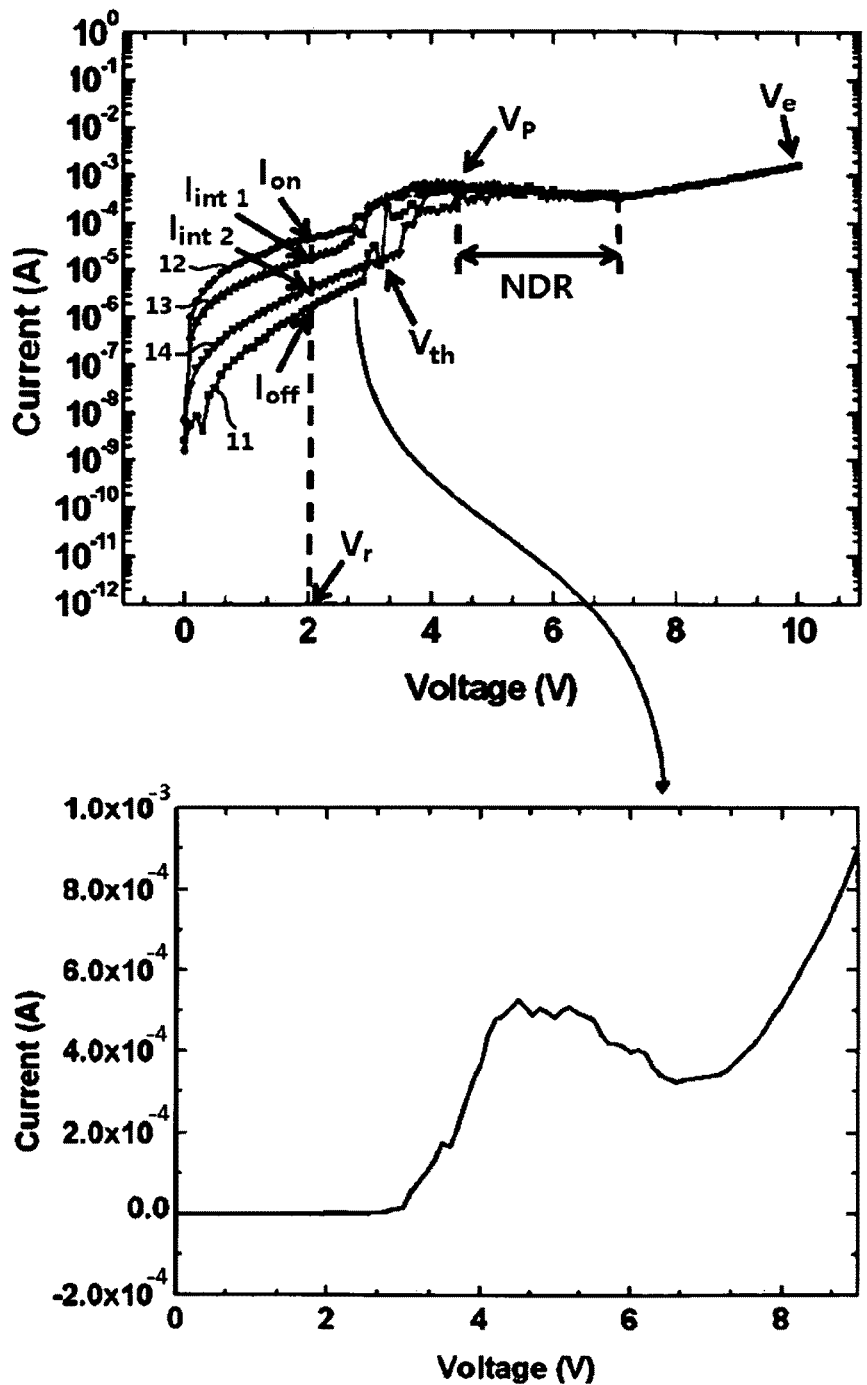
FIG. 12 is a graph showing current-voltage (I-V) characteristics of an OLED display device according to an example embodiment of the present invention.

FIG. 12 is a graph showing current-voltage (I-V) characteristics of an OLED display device according to an example embodiment of the present invention.

The OLED display device of which the I-V characteristics are shown in FIG. 12 has a stack structure of a 150 nm-thick ITO layer as a first conductive layer, a 20 nm-thick CuPc layer as an HIL, a 40 nm-thick α-NPB layer as an HTL, a 60 nm-thick Alq3 layer as an organic EML, a 0.5 nm-thick LiF layer as an EIL, an 80 nm-thick Al layer as a second conductive layer, a 30 nm-thick AIDCN layer as a first organic layer, a 20 nm-thick Al layer as a metal layer, a 30 nm-thick AIDCN layer as a second organic layer, and an 80 nm-thick Al layer as a third conductive layer. The ITO layer as the first conductive layer and the Al layer as the metal layer are processed with $O_2$ plasma. The first conductive layer is processed with $O_2$ plasma for about 30 seconds to obtain a cleaning effect and reduce a work function. Also, the Al layer as the metal layer is processed with $O_2$ plasma for about 300 seconds to form a nanocrystal layer. The process of forming the nanocrystal layer by processing the Al metal layer with $O_2$ plasma is performed in the same manner as described with reference to FIGS. 3 through 5.

The first and second organic layers are formed of AIDCN. Predetermined voltages are applied to the first and second conductive layers of an OLED using the nanocrystal layer, and current is measured. Specifically, a positive voltage is applied to the first conductive layer, and a negative voltage is applied to a third conductive layer so that a current corresponding to a voltage difference between the first and third conductive layers is measured.

Referring to FIG. 12, current increases as a voltage difference increases to a predetermined level. When the voltage difference exceeds the predetermined level, a negative differential resistance (NDR) region where current decreases with an increase in the voltage difference is generated. As the voltage difference is continuously increased, current also increases.

For example, when a voltage difference between the first conductive layer and the third conductive layer is about 3V, current flowing through the OLED increases. That is, current flowing through the OLED sharply increases at a threshold voltage Vth or higher. Also, the current reaches a peak at a voltage difference of about 4.5V. A voltage when the current reaches the peak is referred to as a peak voltage Vp. Also, the NDR region where the current is reduced is generated at a voltage higher than the peak voltage Vp, i.e., in the voltage difference range of about 4.5 to 6V. Thereafter, as the voltage increases from about 6V, the current increases again. In the present example embodiment, a high voltage at which current increases with an increase in the voltage is referred to as an erase voltage Ve.

In the present example embodiment, a program operation, an erase operation, and a read operation are performed based on the phenomenon described with reference to FIG. 12. For instance, the program operation may be set as the NDR region, while the read operation may be set as a subthreshold-voltage region. Also, the erase operation may be set as an erase-voltage region.

In addition, it can be seen that the amount of current flowing through the OLED display device of the present example embodiment during the read operation is varied according to a program voltage.

For example, referring to FIG. 12, a V-I curve I1 is obtained from an initial off-state.

Also, V-I curves I2 to I4 are obtained when different program voltages are applied.

Specifically, the V-I curve I2 is obtained when a program voltage of about 4.5V is applied. The V-I curve I3 is obtained when a program voltage of about 5.3V is applied, and the V-I curve I4 is obtained when a program voltage of about 6V is applied.

The program voltages are set in NDR regions of the V-I curves I2 to I4. In FIG. 12, when a high program voltage is applied, a small current is measured at a read voltage Vr.

The erase operation is performed with the application of an erase voltage Ve, which exceeds the NDR region. That is, after the erase operation is finished, the V-I characteristic of the OLED display device returns to the curve I1.

In the present example embodiment, a driving current flowing through the same OLED display device is varied according to a difference in program voltage, and after the erase operation is performed, the V-I characteristic of the OLED display device returns to the curve I1. Also, even if power supplied to the OLED display device is eliminated, the above-described electrical state is realized in the same manner with the reapplication of power. Accordingly, the OLED display device has the same characteristics as a nonvolatile memory when a program voltage is applied.

Also, even if power supply is interrupted after the program voltage is applied, when power is supplied again, the OLED display device follows a V-I curve corresponding to the program voltage. In other words, as long as an erase operation is not performed, the OLED display device has nonvolatile characteristics so that it returns to a program state with the reapplication of power.

The cause of the above-described phenomenon will now be described. A nanocrystal is not charged at a threshold voltage Vth or lower. In other words, charges are not substantially moved or immaterially moved to the nanocrystal due to a barrier layer. Thus, current slightly increases with an increase in voltage. That is, a nanocrystal layer may be modeled as functioning only as a resistor.

Thereafter, when a difference between voltages applied to the first and third conductive layers is higher than the threshold voltage Vth, the nanocrystal is charged. This is because charges are tunneled through the barrier layer and trapped in the nanocrystal. Thus, current sharply increases at the threshold voltage Vth or higher.

Thereafter, the voltage difference continuously increases and exceeds the peak voltage Vp. Thus, when the voltage difference enters into the NDR region, the nanocrystal is partially charged and partially discharged. Also, due to a field effect of the charges trapped in the nanocrystal and the partial charging/discharging, even if an applied voltage is increased, the amount of current decreases, so that an NDR phenomenon occurs.

When the voltage difference continuously increases, the trapping of charges in the nanocrystal occurs no more, and even the charges trapped in the nanocrystal are tunneled through the barrier layer, and moved to an organic layer. Accordingly, the charges trapped in the nanocrystal are erased at around an erase voltage, and current increases with an increase in voltage difference.

Referring to FIG. 12, it can be seen that when a high program voltage is applied, the nanocrystal is in a high-resistance state. This is because the current of the nanocrystal layer is reduced as compared with when clow program voltage is applied. As can be seen from Equation R=V/I, a relatively small current is measured at a high voltage in the NDR region, so that the application of a high program voltage leads to a reduction in resistance of the nanocrystal layer.

Therefore, when a read voltage is applied after the application of a high program voltage, a small current flows through the nanocrystal layer at the read voltage due to the high-resistance state of the nanocrystal layer. Similarly, when the read voltage is applied after the application of a low program voltage, a large current flows through the nanocrystal layer at the read voltage due to a low-resistance state of the nanocrystal layer.

As described above, the amount of current flowing through the OLED is varied according to an applied program voltage. Accordingly, a driving current required for an emission operation may be set according to the applied program voltage.

Also, a lower enlarged graph of the I-V curve I1 shows the I-V characteristic of the OLED display device after an erase operation is performed. In the lower enlarged graph, the NDR region is observed more clearly at a voltage of about 4V or higher.

Figure 13:
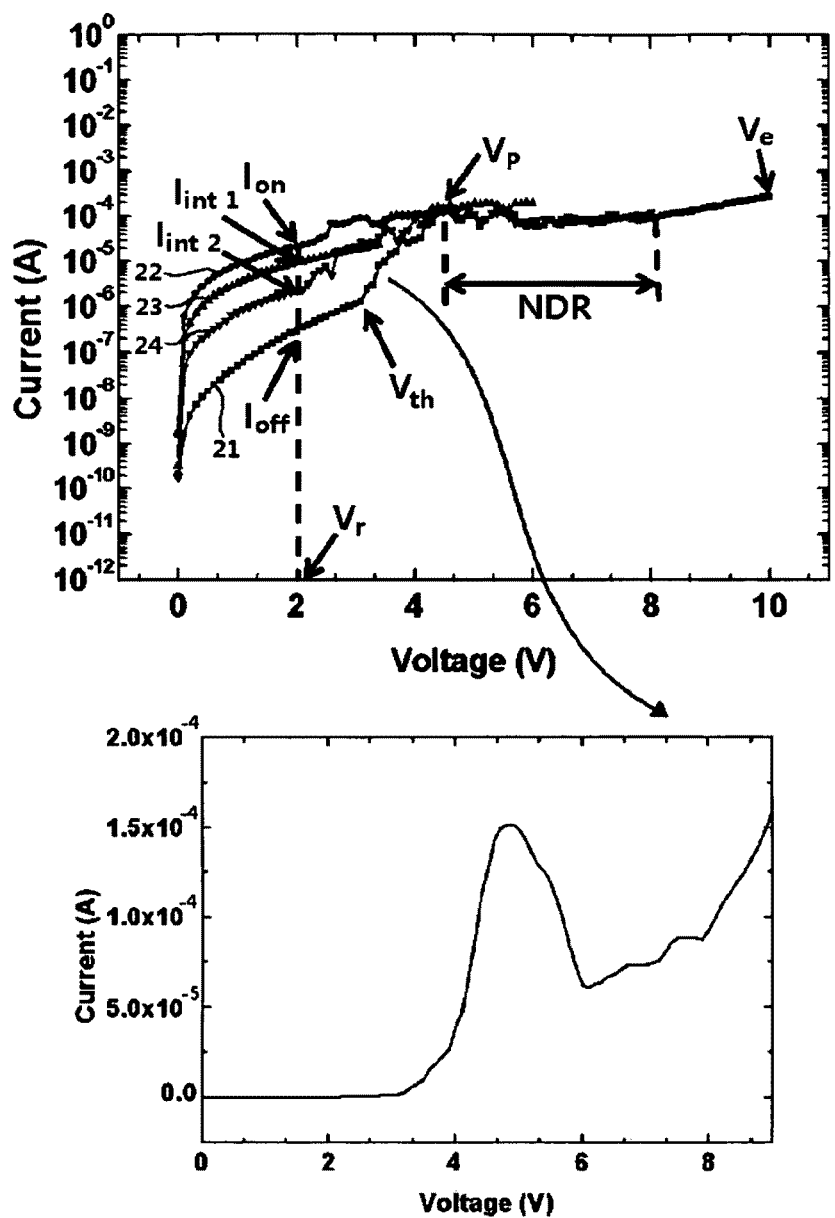
FIG. 13 is a graph showing I-V characteristics of an OLED display device in which first and second organic layers are formed of α-NPD, according to another example embodiment of the present invention.

FIG. 13 is a graph showing I-V characteristics of an OLED display device in which first and second organic layers are formed of α-NPD, according to another example embodiment of the present invention.

The OLED display device according to the present example embodiment is the same as the OLED display device described with reference to FIG. 12 except that each of the first and second organic layers is formed of α-NPD.

Referring to FIG. 13, an NDR region is generated. That is, the OLED display device may have nonvolatile characteristics and a driving current may be set according to a program voltage irrespective of the kinds of the first and second organic layers. Also, a lower enlarged graph of FIG. 13 shows V-I characteristics of the OLED display device after an erase operation is performed. In the enlarged graph, the NDR region is observed more clearly.

Figure 14:
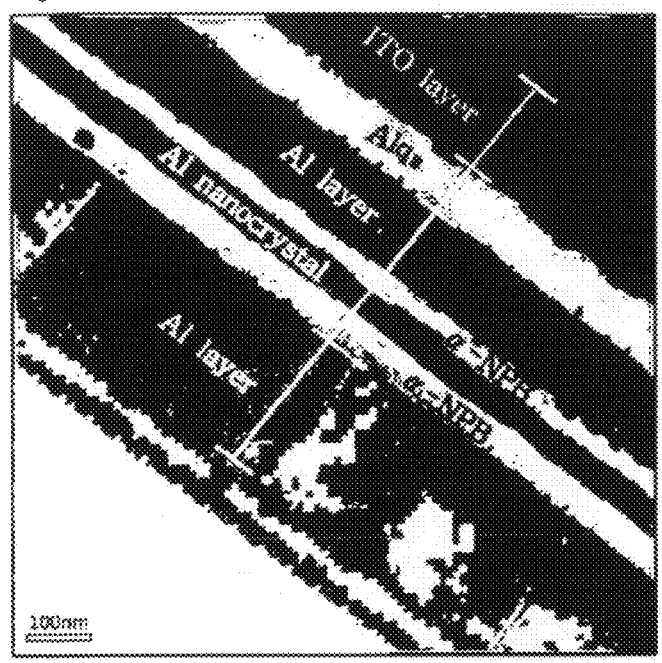
FIGS. 14 and 15 are photographed images of the OLED display device of which the I-V characteristic is shown in FIG. 13.
Figure 15:
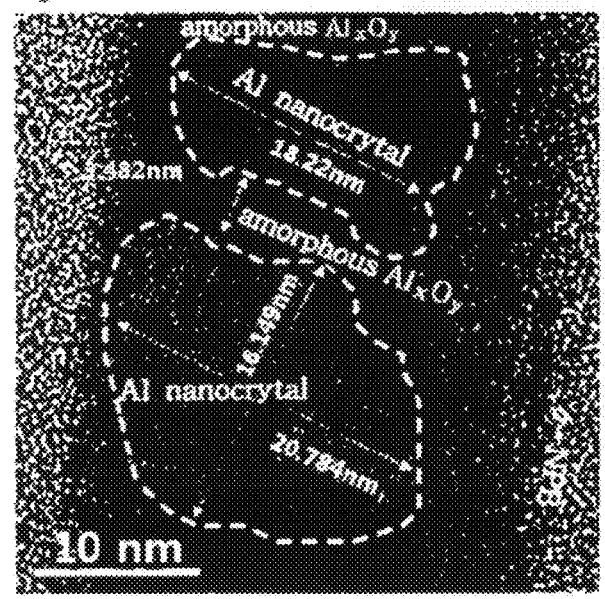

FIGS. 14 and 15 are photographed images of the OLED display device of which the I-V characteristics are shown in FIG. 13.

In particular, referring to FIG. 15, it can be observed that a nanocrystal is formed in a nanocrystal layer and surrounded by a barrier layer.

Drive of Display Panel

Figure 16:
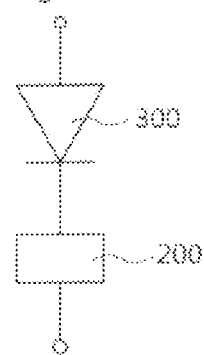
FIG. 16 is an equivalent circuit diagram of the OLED display device shown in FIG. 1 or FIG. 2.

FIG. 16 is an equivalent circuit diagram of the OLED display device shown in FIG. 1 or 2.

Referring to FIG. 16, the OLED display device includes a charge trap device 200 and an OLED 300.

The charge trap device 200 includes a nanocrystal layer 150 shown in FIG. 1 or 2 and may further include a first organic layer 140 and a second organic layer 160 disposed on and under the nanocrystal layer 150, respectively.

As shown in FIG. 1 or 2, the OLED 300 includes a first conductive layer 110, a second conductive layer 130, and an organic EML 120 interposed between the two conductive layers 110 and 130. Of course, a functional organic thin layer, for example, an HTL, an HIL, an ETL, or an EIL may be interposed between the organic EML 120 and the conductive layer 110 or 130 in order to enhance luminous efficiency.

The charge trap device 200 may be switched between a program state and an erase state according to a difference between voltages applied to two terminals of the OLED display device. For example, after a program voltage is applied, even if power supply is interrupted, the charge trap device 200 maintains a program state. When the charge trap device 200 is in the program state, charges are trapped in a nanocrystal of the nanocrystal layer 150. When the charge trap device 200 is in the erase state, charges are emitted from the nanocrystal of the nanocrystal layer 150 with the application of an erase voltage.

Accordingly, a program voltage is applied to both the terminals of the OLED display device so that charges corresponding to desired grayscale are trapped or stored in the charge trap device 200. Also, in order to perform an emission operation, a predetermined read voltage is applied to both the terminals of the OLED display device to generate a driving current. The driving current is supplied to the OLED 300 so that the OLED 300 emits light at a predetermined luminance.

In the above-described operation, a program voltage may be higher than a read voltage. Also, after the emission operation or before a program operation, an erase voltage is applied to the OLED display device so that the charge trap device 200 may be in an erase state. The erase voltage may be higher than the program voltage.

Figure 17:
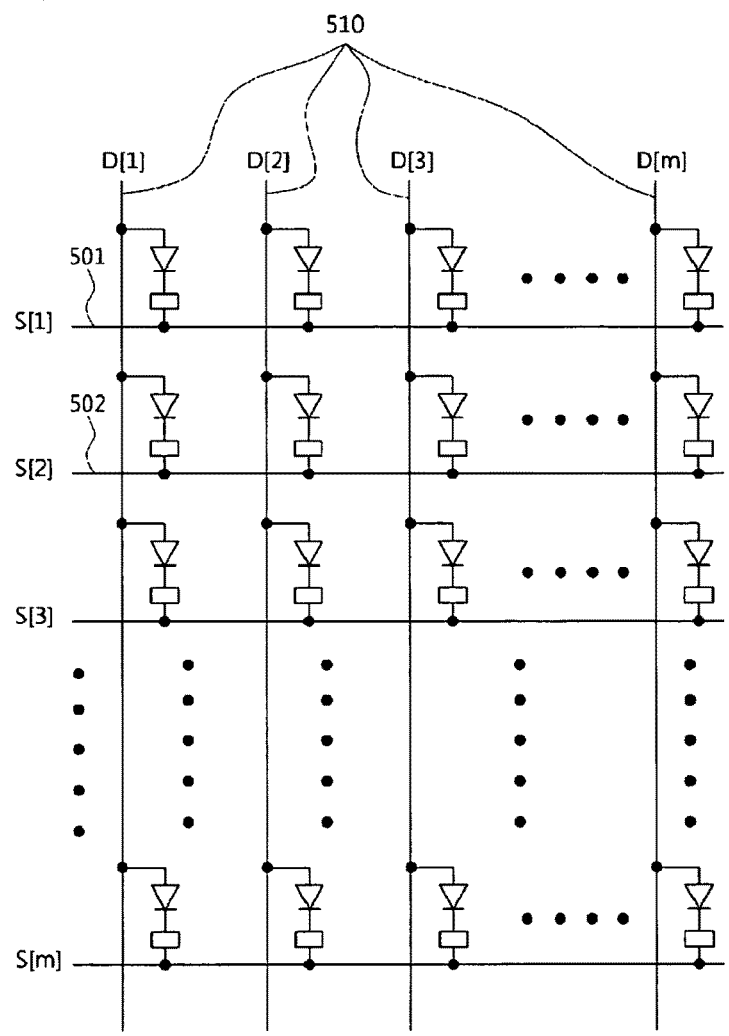
FIG. 17 is a circuit diagram of a display panel in which the OLED display device of FIG. 16 is realized as a unit pixel, according to an example embodiment of the present invention.

FIG. 17 is a circuit diagram of a display panel in which the OLED display device of FIG. 16 is realized as a unit pixel, according to an example embodiment of the present invention.

Referring to FIG. 17, the display panel includes a plurality of scan lines 501 and 502, which extend in a first direction, a plurality of data lines 510, which intersect the scan lines 501 and 502, and a plurality of pixels disposed in regions where the scan lines 501 and 502 intersect the data lines 510.

Each of the pixels has the circuit configuration shown in FIG. 16. In other words, each of the pixels includes a charge trap device 200 and an OLED 300 connected in series to the charge trap device 200.

In the display panel, the pixels having the same configuration are repetitively arranged, and the respective pixels are selected in response to scan signals S[1], S[2], . . . and S[n] applied through the scan lines 501 and 502. Grayscales to be expressed by the selected pixels are determined in response to data signals D[1], D[2], . . . and D[m] applied through the data lines 510.

Figure 18:
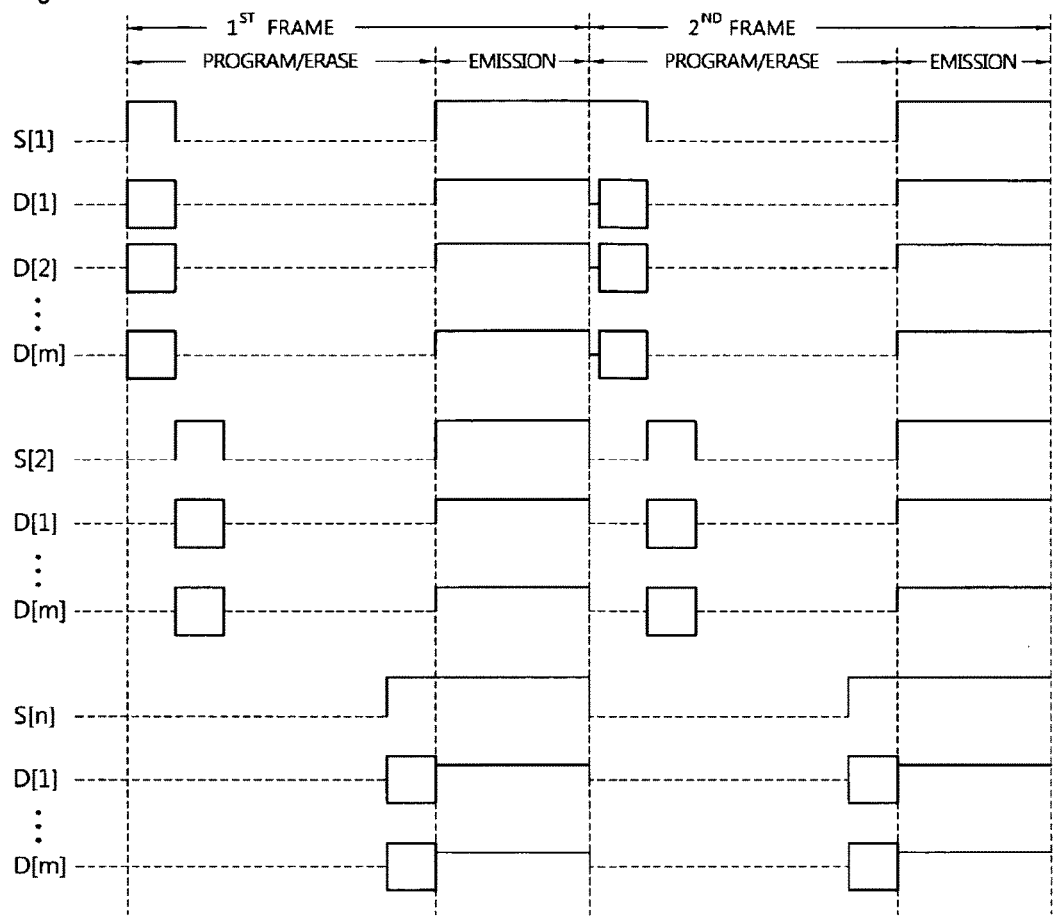
FIG. 18 is a timing diagram illustrating operation of the display panel shown in FIG. 17, according to an example embodiment of the present invention.

FIG. 18 is a timing diagram illustrating operation of the display panel shown in FIG. 17.

Referring to FIG. 18, the pixels connected to the respective scan lines 501 and 502 perform a program operation or an erase operation. The program or erase operation may be sequentially performed on the scan lines 501 and 502. The erase operation involves applying a voltage difference corresponding to an erase voltage Ve between the data line 510 and the scan line 501 or 502. When the erase voltage Ve is applied, a low grayscale may be expressed during subsequent application of a read voltage. Also, during the program operation, the corresponding pixel may express a grayscale corresponding to an applied program voltage.

Specifically, a first scan line 501 is enabled, and a program/erase voltage is applied to pixels connected to the first scan line 501 to perform the program/erase operation. Subsequently, a second scan line 502 is enabled, and the program/erase operation is performed on pixels connected to the second scan line 502. The program/erase operation is performed until a final scan line (i.e., an n-th scan line) is enabled and the program/erase operation is performed on pixels connected to the final scan line.

When the first scan signal S[1] is enabled, pixels connected to the first scan line 501 are selected. In other words, a voltage is physically applied to a first electrode of the OLED display device shown in FIG. 16. Data signals D[1], D[2], . . . and D[m] are applied to the pixels connected to the first scan line 501. Each of the data signals D[1], D[2], . . . and D[m] applied to the respective pixels corresponds to a program voltage or an erase voltage mentioned in the present invention. More specifically, a difference between a voltage level of each of the data signals D[1], D[2], . . . and D[m] applied to the respective pixels and a voltage level of the first scan signal S[1] corresponds to the program voltage or the erase voltage. As a result, each of the pixels is programmed or erased to a predetermined level with the application of the corresponding one of the data signals D[1], D[2], . . . and D[m]. When each of the pixels is programmed, charges are trapped in a charge trap device of the pixel. When each of the pixels is erased, the charges are erased from the charge trap device of the pixel. Also, while the first scan line S[1] is being enabled and the data signals D[1], D[2], . . . and D[m] are being applied, the remaining scan lines may be floated.

Thereafter, the second scan signal S[2] is enabled, and the data signals D[1], D[2], . . . and D[m] are applied to pixels connected to the second scan line 502. During the enabling of the second scan signal S[2], the remaining scan lines may be floated so that no voltage is applied to the remaining scan lines.

The above-described process is continued until a final n-th scan signal is enabled and the data signals D[1], D[2], . . . and D[m] are applied to pixels connected to an n-th scan line.

Subsequently, all the scan lines are enabled, and a data signal corresponding to a read voltage is applied through the data line 510 to all the pixels. In response to the data signal corresponding to the read voltage, all the pixels perform an emission operation at the same time. Since the respective pixels enter into a program state or an erase state according to desired grayscales, the pixels emit light at luminances corresponding to the program state or the erase state with the application of the read voltage.

As described above, when the display of a frame image is finished, the above-described operations are repeated so as to display the next new frame image.

FIG. 19 is a timing diagram illustrating operation of the display panel shown in FIG. 17, according to another example embodiment of the present invention.

Referring to FIG. 19, all the pixels included in the display panel maintain an erase state. That is, all the pixels may be in the erase state by activating all scan signals S[1], S[2], ..., S[m] and applying data signals D[1], D[2], ... and D[m] having levels corresponding to the erase state to all the pixels.

Thereafter, pixels connected to the respective scan lines 501 and 502 may perform a program operation. The program operation may be sequentially performed on the scan lines 501 and 502. Specifically, the first scan line 501 is activated, and program voltages corresponding to the data signals D[1], D[2], ... and D[m] are applied to the pixels connected to the first scan line 501 to perform the program operation. After that, the second scan line 502 is activated, and a program operation is performed on the pixels connected to the second scan line 502. The program operation is continued until the final scan line (i.e., the n-th scan line) is activated and the program operation is performed on the pixels connected to the final scan line.

When the first scan signal S[1] is activated, the pixels connected to the first scan line 501 are selected. In other words, a voltage is physically applied to the first electrode of the OLED display device shown in FIG. 16. The data signals D[1], D[2], ... and D[m] are applied to the pixels connected to the first scan line 501. Each of the data signals D[1], D[2], ... and D[m] applied to the respective pixels corresponds to a program voltage mentioned in the present invention. More specifically, the difference between the voltage level of each of the data signals D[1], D[2], ... and D[m] applied to the respective pixels and the voltage level of the first scan signal S[1] corresponds to the program voltage. As a result, each of the pixels is programmed to a predetermined level with the application of the corresponding one of the data signals D[1], D[2], ... and D[m]. While the first scan line S[1] is being enabled and the data signals D[1], D[2], ... and D[m] are being applied, the remaining scan lines may be floated.

Thereafter, the second scan signal S[2] is activated, and the data signals D[1], D[2], ... and D[m] are applied to the pixels connected to the second scan line 502. During the enabling of the second scan signal S[2], the remaining scan lines may be floated so that no voltage is applied to the remaining scan lines.

The above-described process is continued until a final n-th scan signal is activated and the data signals D[1], D[2], ... and D[m] are applied to pixels connected to the n-th scan line.

A program voltage applied to each of the pixels corresponds to a grayscale expressed by the OLED 300 (refer to FIG. 160).

When all the pixels of the display panel are programmed, all the scan lines 501 and 502 are activated, and a read voltage is applied to all the pixels connected to all the scan lines 501 and 502. With the application of the read voltage, all the pixels perform an emission operation at a luminance corresponding to the program voltage.

After the emission operation is finished, all the scan lines 501 and 502 of the display panel are enabled, and a data signal corresponding to an erase voltage is applied through the data lines 510. As a result, all the pixels enter into an erase state.

The above-described process is repetitively performed to display the next image frame.

In addition to the method of enabling the scan lines described with reference to FIGS. 18 and 19, according to another example embodiment of the present invention, after odd-numbered scan lines are sequentially enabled, even-numbered scan lines may be sequentially enabled. Of course, the enabling of even-numbered scan lines may be followed by the enabling of odd-numbered scan lines.

In the present example embodiment, after a program operation or an erase operation is performed on all the pixels of the display panel, a read voltage is applied to all the pixels to perform an emission operation.

Furthermore, the pixels connected to the corresponding scan line, which finish the program operations, may be floated. In other words, no voltage may be applied to the pixels connected to the corresponding scan line. The pixels connected to the corresponding scan line may remain floated until a read operation is performed. Thus, during the read operation, a predetermined read voltage is applied through the data lines to the pixels connected to the corresponding scan line.

Therefore, when the read operation is performed, the pixels of the display panel perform emission operations not sequentially but at the same time.

In the above-described process, after a frame image is displayed on the display panel, an erase voltage is applied to all the pixels of the display panel to display the next frame image to put all the pixels into an erase state. Thus, grayscale data may be stored in the pixels having the charge trap devices, and an image may be displayed at the same time.

In the present invention, each pixel of the display panel includes a charge trap device and an organic light emitting diode (OLED). The charge trap device is disposed on or under the OLED and performs a memory operation according to charges trapped in a nanocrystal layer. Also, pixels, which are in the erase state, are sequentially programmed, and all the pixels of the display panel emit light at the same time with the application of a read voltage.

According to the present invention as described above, each of pixels can have a high aperture ratio and a wide viewing angle and efficiently display an image through a mechanism in which the pixels are erased, programmed, and emit light at the same time. In particular, a residual image caused by an image having sequential frames can be eliminated, and grayscales can be expressed more clearly.

While the invention has been shown and described with reference to certain example embodiments thereof, it will be understood by those skilled in the art that various changes in form and details may be made therein without departing from the spirit and scope of the invention as defined by the appended claims.

The invention claimed is:

1. A method of driving a display panel, comprising:
   sequentially applying a data signal corresponding to a program voltage or an erase voltage to pixels to put each of the pixels into a program state or an erase state; and
   applying a data signal corresponding to a read voltage to all the pixels put into the program state or the erase state such that all the pixels emit light at the same time.

2. The method according to claim 1, wherein the putting of each of the pixels into the program state or the erase state comprises:
   applying a scan signal to a corresponding scan line to select pixels connected to the corresponding scan line; and
   applying data signals corresponding to the program voltage or the erase voltage to the selected pixels.

3. The method according to claim 2, wherein each of the pixels comprises:
  a charge trap device in which charges are trapped in the program state, and from which the charges are removed in the erase state; and
  an organic light emitting diode (OLED) connected to the charge trap device,
  wherein each of the pixels receives the read voltage and emits light at a predetermined luminance.

4. The method according to claim 3, wherein the charge trap device comprises a nanocrystal layer, and the amount of charge trapped in the nanocrystal layer is controlled according to the program voltage or the erase voltage.

5. The method according to claim 4, wherein a resistance of the charge trap device increases with an increase in the program voltage.

6. The method according to claim 2, wherein scan lines other than the scan line to which the scan signal is applied are floated.

7. The method according to claim 6, wherein the erase voltage is set to a higher level than the program voltage.

8. The method according to claim 1, wherein the program voltage is set to a higher level than the read voltage.

9. The method according to claim 8, wherein the erase voltage is set to a higher level than the program voltage.

10. A method of driving a display panel having pixels disposed in regions where a plurality of scan lines intersect a plurality of data lines, the method comprising:
  selecting a predetermined scan line and applying a data signal corresponding to a program voltage to pixels connected to the selected scan line to put charge trap devices of the pixels into a program state; and
  finishing programming all the pixels of the display panel, selecting all the pixels, and applying a data signal corresponding to a read voltage to all the pixels such that organic light emitting diodes (OLEDs) of all the pixels emit light at the same time,
  wherein each of the charge trap devices comprises a nanocrystal layer in which charges are trapped, and each of the OLEDs is disposed on or under the corresponding charge trap device.

11. The method according to claim 10, wherein the program voltage is set in a negative differential resistance (NDR) region where current decreases with an increase in voltage.

12. The method according to claim 10, wherein the pixel put into the program state is floated before the pixel emits light.

13. The method according to claim 12, wherein the pixel is floated by applying no voltage to a scan line connected to the corresponding pixel.

14. The method according to claim 10, further comprising, after causing the OLEDs to emit light at the same time, applying a data signal corresponding to an erase voltage to all the pixels of the display panel to put all the pixels of the display panel into an erase state.

15. The method according to claim 14, wherein the erase state is a state in which the charges trapped in the charge trap device are removed.

16. A method of driving a display panel having a pixel including a charge trap device and an organic light emitting diode (OLED), the method comprising:
  applying a program voltage to the pixel to control a resistance of the charge trap device;
  applying a read voltage to the pixel having the charge trap device of which the resistance is controlled to cause the OLED to emit light; and
  applying an erase voltage higher than the program voltage to the pixel to erase trapped charges from the charge trap device.

17. The method according to claim 16, wherein the read voltage is set to a lower level than the program voltage, and the OLED emits light according to a driving current corresponding to the controlled resistance.

18. The method according to claim 16, wherein the resistance of the charge trap device decreases with an increase in the program voltage.

19. A method of driving a display panel having a pixel including a charge trap device and an organic light emitting diode (OLED), the method comprising:
  applying a program voltage or an erase voltage to the pixel to control a resistance of the charge trap device; and
  applying a read voltage to the pixel having the charge trap device of which the resistance is controlled to cause the OLED to emit light,
  wherein the program voltage is lower than the erase voltage and higher than the read voltage.

20. The method according to claim 19, wherein the resistance of the charge trap device increases with an increase in the program voltage, and when the erase voltage is applied to the pixel, the resistance of the charge trap device is minimized.

* * * * *